US011477352B1

(12) United States Patent
Palve et al.

(10) Patent No.: US 11,477,352 B1
(45) Date of Patent: Oct. 18, 2022

(54) ACCESSORY DEVICE HEAT DISSIPATION BY PARENT DEVICE

(71) Applicant: Microsoft Technology Licensing, LLC, Redmond, WA (US)

(72) Inventors: Lalit Anil Palve, Seattle, WA (US); Rhishikesh A. Sathe, Bothell, WA (US); Andrew D. Delano, Woodinville, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 0 days.

(21) Appl. No.: 17/226,868

(22) Filed: Apr. 9, 2021

(51) Int. Cl.
*H04N 5/225* (2006.01)
*G03B 17/55* (2021.01)
(Continued)

(52) U.S. Cl.
CPC ......... *H04N 5/22521* (2018.08); *G03B 17/55* (2013.01); *G03B 17/561* (2013.01);
(Continued)

(58) Field of Classification Search
CPC ............... H04N 5/2251; H04N 5/2252; H04N 5/22521; H04N 5/2253; H04N 5/2254; H04N 5/2257; G03B 17/02; G03B 17/55; G03B 17/561; G03B 17/566; G03B 2217/002; H05K 1/0201–021;
(Continued)

(56) References Cited

U.S. PATENT DOCUMENTS

| 5,991,468 A | 11/1999 | Murakami et al. |
| 2012/0182527 A1 | 7/2012 | Enomoto et al. |

(Continued)

FOREIGN PATENT DOCUMENTS

| CN | 202758163 U | 2/2013 |
| CN | 203037982 U | 7/2013 |

(Continued)

OTHER PUBLICATIONS

"International Search Report and Written Opinion Issued in PCT Application No. PCT/US22/021073", dated Jul. 14, 2022, 15 Pages.

*Primary Examiner* — Twyler L Haskins
*Assistant Examiner* — Akshay Trehan
(74) *Attorney, Agent, or Firm* — Fiala & Weaver P.L.L.C.

(57) ABSTRACT

Embodiments enable an accessory device coupled to a parent device to transfer heat directly to the parent device via convection thereby enabling the parent device to help cool the accessory device. The electronic device includes a device body housing coupled to and housing a heat-generating component, a device foot coupled to an exterior surface of the device body housing and a first mating element. The parent device includes a planar mounting surface, and a second mating element adapted to engage with the first mating element of the accessory device to mount the accessory device to the parent device, and brings the planar portion of the device foot housing into contact with the planar mounting surface. The heat-generating component is thermally coupled to the parent device via a thermal circuit comprising the device body house, the device foot, the planar portion thereof, and the planar mounting surface of the parent device.

20 Claims, 9 Drawing Sheets

(51) Int. Cl.
*G03B 17/56* (2021.01)
*H05K 7/20* (2006.01)
*G06F 1/16* (2006.01)
*F16B 1/00* (2006.01)
*F16M 13/02* (2006.01)

(52) U.S. Cl.
CPC ......... *G03B 17/566* (2013.01); *H04N 5/2252* (2013.01); *H04N 5/2253* (2013.01); *H04N 5/2257* (2013.01); *H05K 7/2039* (2013.01); *F16B 2001/0035* (2013.01); *F16M 13/02* (2013.01); *F16M 2200/08* (2013.01); *G06F 1/1605* (2013.01); *G06F 1/1607* (2013.01)

(58) Field of Classification Search
CPC .. H05K 5/0073; H05K 5/0204; H05K 5/0234; H05K 5/0213; H05K 7/2039–20518; G06F 1/1686; G06F 1/1605; G06F 1/1607; F16M 13/02; F16M 13/022; F16M 2200/08; F16B 2001/0035
See application file for complete search history.

(56) References Cited

U.S. PATENT DOCUMENTS

| | | | |
|---|---|---|---|
| 2012/0257646 A1* | 10/2012 | Yee | G05D 23/192 |
| | | | 219/628 |
| 2015/0049243 A1* | 2/2015 | Samuels | H04N 5/2253 |
| | | | 348/374 |
| 2018/0259832 A1* | 9/2018 | Chen | G03B 17/55 |
| 2019/0158709 A1 | 5/2019 | Petty et al. | |
| 2020/0059583 A1 | 2/2020 | Tamura | |
| 2020/0064882 A1 | 2/2020 | Chiu | |

FOREIGN PATENT DOCUMENTS

| | | |
|---|---|---|
| CN | 203606775 U | 5/2014 |
| CN | 204442508 U | 7/2015 |
| EP | 3163864 A1 | 5/2017 |
| TW | M597877 U | 7/2020 |
| WO | 2017175949 A1 | 10/2017 |

* cited by examiner

ACCESSORY DEVICE HEAT DISSIPATION BY PARENT DEVICE

BACKGROUND

The capabilities of computing and other electronic devices often may be augmented by the addition of accessory devices. The capabilities of such devices have been increasing due to the ubiquity of inexpensive yet powerful processing and sensing devices. However, processing and sensing capabilities can present cooling challenges for the accessory devices.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Electronic devices are described herein that enable an accessory device coupled to a parent device to transfer heat directly to the parent device via convection thereby enabling the parent device to help cool the accessory device. In one aspect, an electronic device includes: a device body housing that is coupled to and houses a heat-generating component, a device foot that includes a device foot housing coupled to an exterior surface of the device body housing, a first mating element connected to the device foot housing, and a first electrical connector that protrudes from a planar portion of the device foot housing. In a further aspect, a parent device includes a planar mounting surface, and a second mating element adapted to engage with the first mating element of the accessory device in a manner that mounts the accessory device to the parent device, and brings the planar portion of the device foot housing into contact with the planar mounting surface. The parent device further includes a second electrical connector located on the planar mounting surface and adapted to engage with the first electrical connector when the first electronic device is mounted to the second electronic device. The contact between the planar portion of the device foot housing and the planar mounting surface completes a thermal circuit that includes the heat-generating component, the device body housing, the device foot housing and the planar mounting surface and that facilitates the transfer of heat from the heat-generating component to the parent device.

In a further aspect, an accessory device may further include a heat sink element coupled between the heat-generating component and the device body housing at a plurality of coupling points, and wherein each coupling point includes thermal interface material disposed between the heat-generating component and the device body housing.

In an additional aspect, the planar portion of the device foot housing and planar mounting surface of the parent device each includes magnetic materials that couple the devices together at the respective planar surfaces with sufficient force to facilitate heat transfer between the two devices.

In further aspect, the device foot may further include a hinging member that flexibly couples the accessory device to the planar portion of the device foot enabling strain relief whereby the accessory device may be impacted or otherwise caused to move without breaking the coupling between the accessory device and parent device.

Further features and advantages, as well as the structure and operation of various examples, are described in detail below with reference to the accompanying drawings. It is noted that the ideas and techniques are not limited to the specific examples described herein. Such examples are presented herein for illustrative purposes only. Additional examples will be apparent to persons skilled in the relevant art(s) based on the teachings contained herein.

BRIEF DESCRIPTION OF THE DRAWINGS/FIGURES

The accompanying drawings, which are incorporated herein and form a part of the specification, illustrate embodiments of the present application and, together with the description, further serve to explain the principles of the embodiments and to enable a person skilled in the pertinent art to make and use the embodiments.

Figure 1:
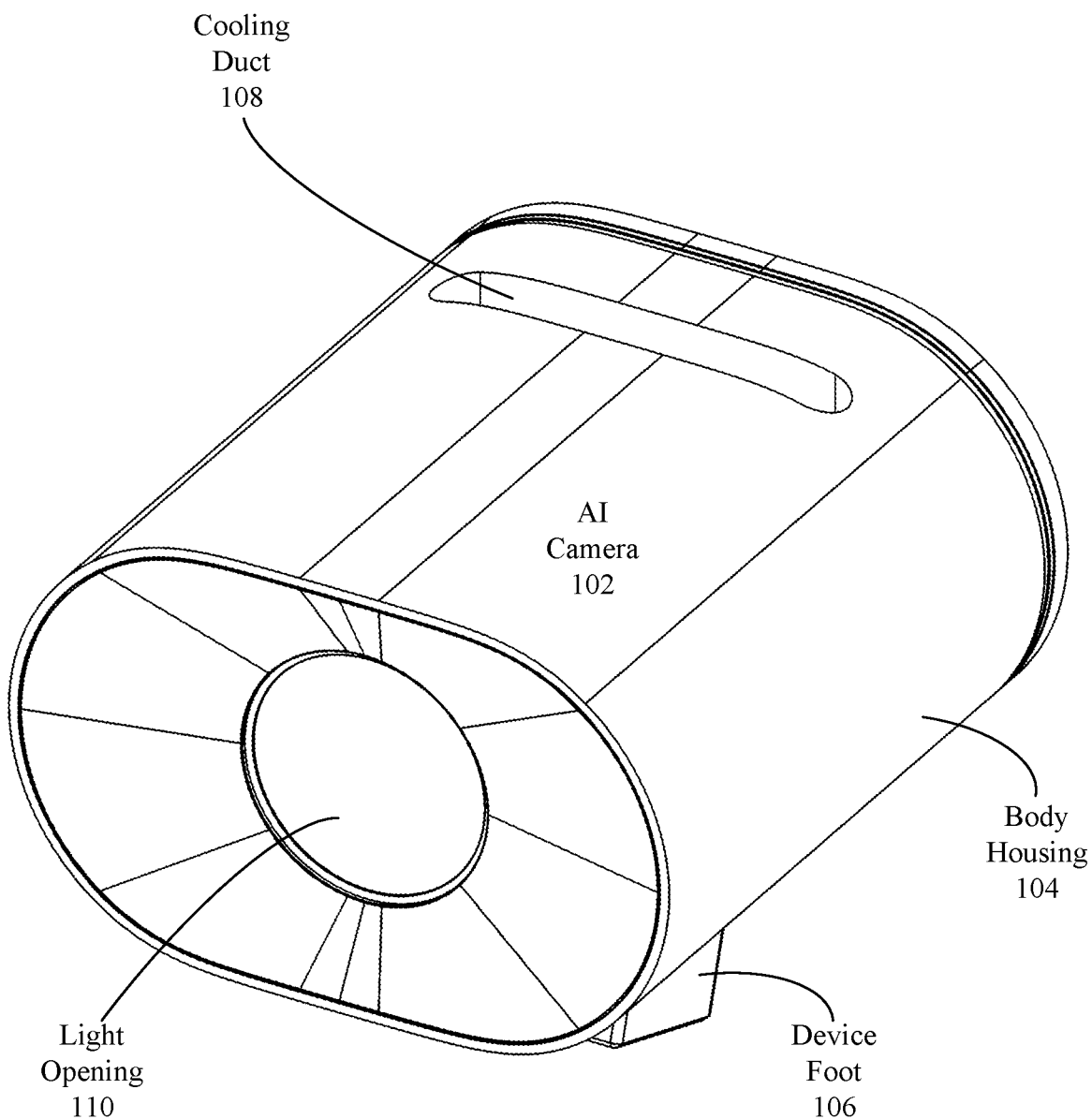
FIG. 1 depicts an example accessory device, according to an embodiment.

The features and advantages of embodiments will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

I. Introduction

The present specification and accompanying drawings disclose one or more embodiments that incorporate the features of the present invention. The scope of the present invention is not limited to the disclosed embodiments. The disclosed embodiments merely exemplify the present invention, and modified versions of the disclosed embodiments are also encompassed by the present invention. Embodiments of the present invention are defined by the claims appended hereto.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

In the discussion, unless otherwise stated, adjectives such as "substantially" and "about" modifying a condition or relationship characteristic of a feature or features of an embodiment of the disclosure, are understood to mean that the condition or characteristic is defined to within tolerances that are acceptable for operation of the embodiment for an application for which it is intended.

Numerous exemplary embodiments are described as follows. It is noted that any section/subsection headings provided herein are not intended to be limiting. Embodiments are described throughout this document, and any type of embodiment may be included under any section/subsection. Furthermore, embodiments disclosed in any section/subsection may be combined with any other embodiments described in the same section/subsection and/or a different section/subsection in any manner.

II. Example Embodiments

As described above, processing and sensing capabilities of modern accessory devices can present cooling challenges for the such devices. For example, it may be difficult or impossible to eliminate the heat generated by processing and sensing components without active cooling. That is, heat removal may be facilitated by a fan that circulates cooling air. Such a fan, however, generates noise that may interfere with on-board sensors such as microphones.

Passive cooling without a fan may be used, but may require that the device have an undesirable size and/or weight. That is, a device with more surface area can eject more heat. However, a larger device not only weighs more, but may also end up being aesthetically unacceptable.

As described above, accessory device embodiments disclosed herein include a thermal circuit that enables such accessory devices to transfer a portion of the heat generated by components housed therein a parent device to which such devices are coupled. For example, FIG. 1 depicts a drawing 100 of an example accessory device, according to an embodiment. In particular, the example accessory device shown in FIG. 1 takes the form of an artificial intelligence (AI) camera 102. It will be appreciated that other example accessory devices, and as described further below, need not comprise or include a camera or other imaging sensor. Additionally, many other types and configurations of accessory devices having various form factors may also be used within the scope of the present disclosure. AI camera 102 of FIG. 1 includes a body housing 104, a device foot 106, a cooling duct 108 and a light opening 110. Although not shown in FIG. 1 due to the perspective, AI camera 102 also includes a microphone 512 as illustrated in, and described below in conjunction with, FIG. 5.

Body housing 104 houses the electronic components that comprise the AI camera 102. Such components include (as will be described in detail below), an imaging sensor and a processing component. Light opening 110 comprises an opening that permits light to enter body housing 104 and reach the imaging sensor (not shown in FIG. 1). In embodiments, body housing 104 is formed from a material with suitable heat conduction properties. For example, body housing 104 may be formed from metals such as aluminum or copper alloys. Alternative, embodiments may form body housing 104 out of a suitably chosen thermally conductive plastic or other composite.

Device foot 106 is coupled to and integrates with body housing 104. Device foot 106 comprises the physical, electrical and thermal coupling between AI camera 102 and a parent device. Like body housing 104, device foot 106 may be formed from thermally conductive materials such as metals, aluminum alloys, thermally conductive plastics, and the like. Cooling duct 108 comprises an opening that passes through body housing 104 generally from its bottom surface to its top surface. As will described in more detail below, the portion of body housing 104 that comprises cooling duct 108 is coupled to one or more heat generating components disposed within AI camera 102. A more detailed description of the purpose and function of each of body housing 104, device foot 106, cooling duct 108 and light opening 110 is included herein below in conjunction with the description of detailed exploded and cutaway views of AI camera 102.

Figure 2:
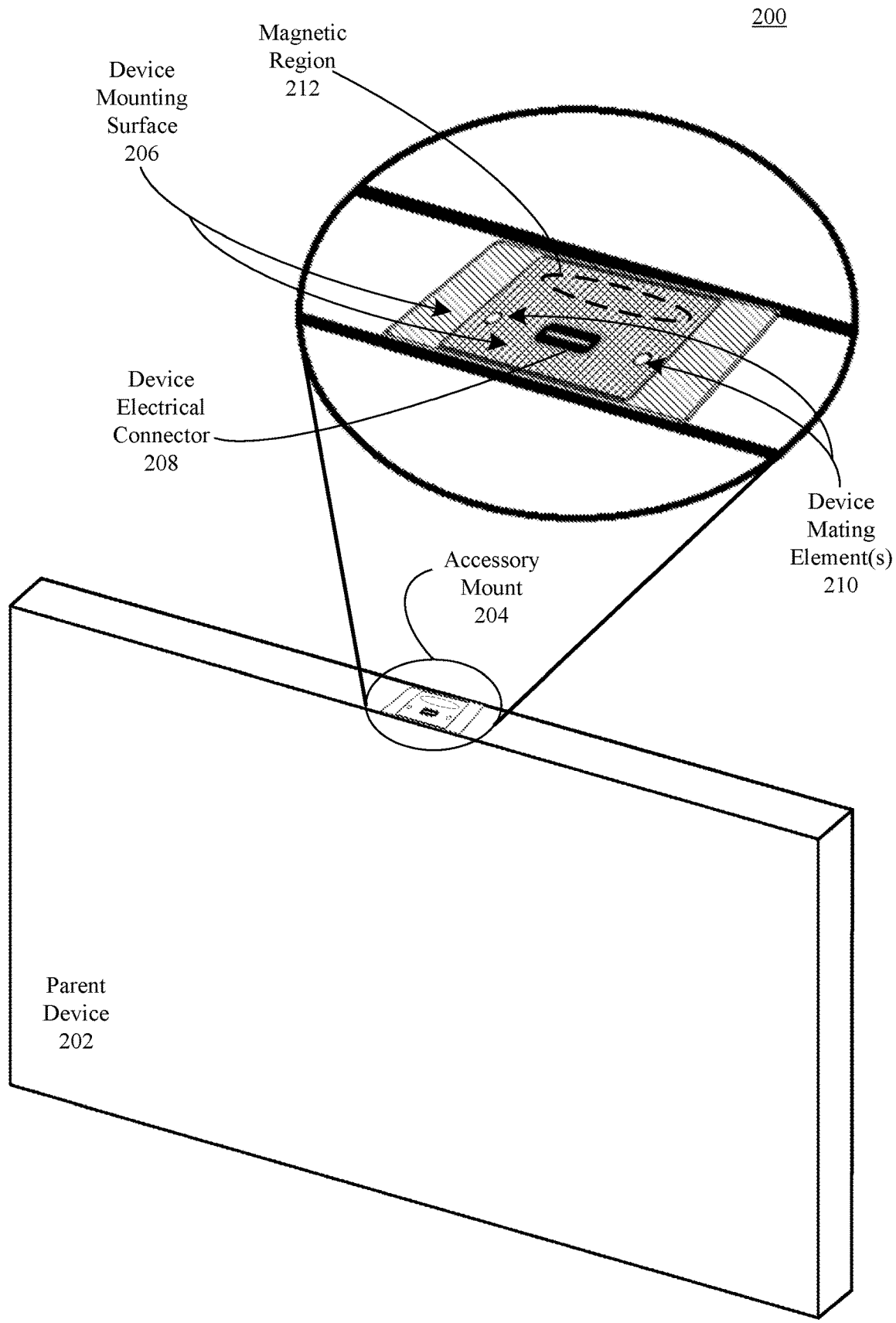
FIG. 2 depicts an example parent device including an accessory mount, according to an embodiment.

As mentioned above, AI camera 102 couples to a parent device via device foot 106. FIG. 2 depicts a drawing 200 of an example parent device 202 including an accessory mount 204, according to an embodiment. Accessory mount 204 includes a device mounting surface 206, a device electrical connector 208, a magnetic region 212 and device mating element(s) 210.

In embodiments, device electrical connector 208 and device mating element(s) 210 correspond to a complementary electrical connector and mating elements, respectively, disposed on a surface of device foot 106 (as will be described in further detail herein below). In an embodiment, device electrical connector 208 comprises one of a male or female USB, USB-C, lightning, micro-USB, or other type of suitable electrical connector. However, these examples are not intended to be limiting, and electrical connector 208 may generally comprise any connector suitable for facilitating an electrical connection of any kind (e.g., power and/or data signaling) between an accessory device and a parent device.

In embodiments, device mating element(s) 210 may comprise, for example, holes or other receiving means configured to receive pins or other types of complementary mating elements disposed on device foot 106 of AI camera 102. Device mating element(s) 210 may be configured to align accessory mount 204 with device foot 106 of AI camera 102 in a manner that facilitates their coupling and electrical connection via respective connectors.

Device mounting surface 206 of accessory mount 204 as shown in FIG. 2 includes magnetic region 212 as depicted by an ellipse with a dashed line. It should be understood that embodiments are not limited to a magnetic region located strictly in the illustrated area, nor of strictly the illustrated size or shape. Instead, it should be understood that accessory mount 204 includes one or more magnets or magnetic materials (e.g., steel or other ferromagnetic material) capable of generating sufficient attractive magnetic force between AI camera 102 and parent device 202.

In embodiments, device mounting surface 206 of accessory mount 204 may include two (or more) regions as depicted in FIG. 2 by the differing background hashing for the respective areas. For example, the surface region including magnetic region 212, device electrical connector 208, and device mating element(s) 210 may comprise, as described above, steel. Such steel may be attracted to a corresponding magnet or magnetic region of device foot 106 of AI camera 102. Alternatively, such steel may serve to pass and/or focus magnetic flux generated by a permanent magnet disposed within parent device 202 in an area below the steel surface of accessory mount 204. The remaining surface region depicted as flanking the steel region just described may, in embodiments, comprise a different material as necessary to facilitate heat transfer between AI camera 102 and parent device 202. For example, device mounting surface 206 may require the use of materials with high thermal conductivity such as aluminum or copper alloys instead of steel in order to conduct enough heat into parent device 202 from AI camera 102. Device electrical connector 208, device mating element(s) 210 and magnetic region 212 of accessory mount 204 will be discussed further herein below in conjunction with description of the corresponding components of device foot 106 of AI camera 102.

Figure 3:
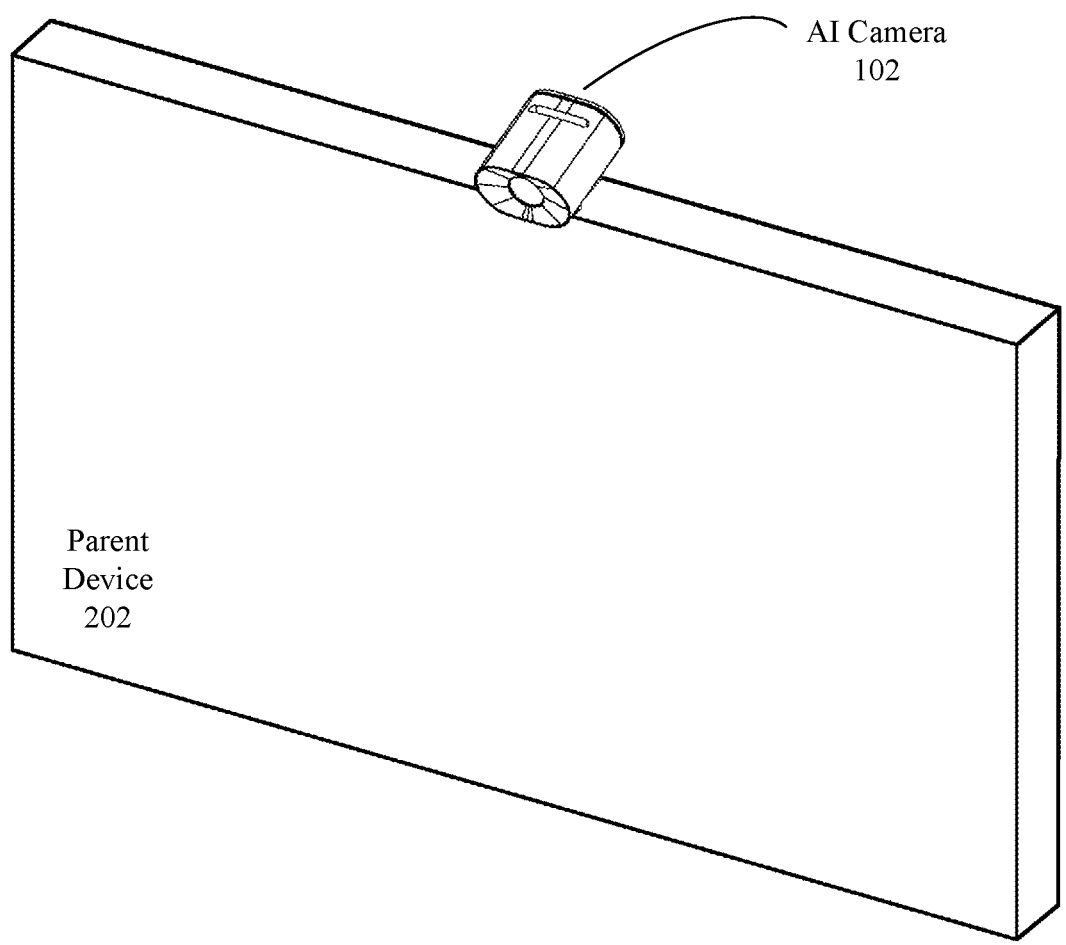
FIG. 3 depicts an example accessory device coupled to a parent device, according to an embodiment.

It should be understood that parent device 202 as depicted in FIG. 2 is merely exemplary, and other form factors and configurations are possible in other embodiments. For example, parent device 202 may comprise a tablet computer, laptop computer or other type of computing device. Parent device 202 may also comprise a display device suitable for use with such computing devices, or a standalone display device such as a television or monitor. Moreover, parent device 202 may include other types of devices that one may not ordinarily consider to be a "parent" device, and which may not include computing functionality. For example, parent device 202 may comprise a docking station or other type of stand configured to provide AI camera 102 with the appropriate electrical, physical and thermal coupling as described in detail herein. An embodiment of such a parent device 202 may itself be standalone, or may include connectivity between a coupled AI camera 102 and other devices (e.g., via USB or Ethernet/network connections). Finally, FIG. 3 is a drawing 300 of AI camera 102 coupled to parent device 202 at the interface between device foot 106 of AI camera 102, and accessory mount 204 of parent device 202, according to an embodiment. Description of additional illustrations of AI camera 102 continues below.

Figure 4A:
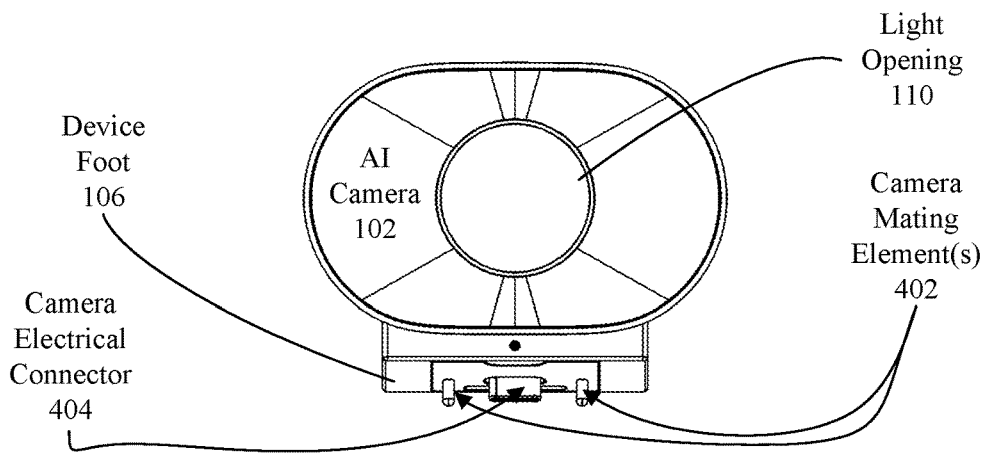
FIGS. 4A-4C depict front, side and bottom views of the example accessory device of FIG. 1, according to an embodiment.
Figure 4B:
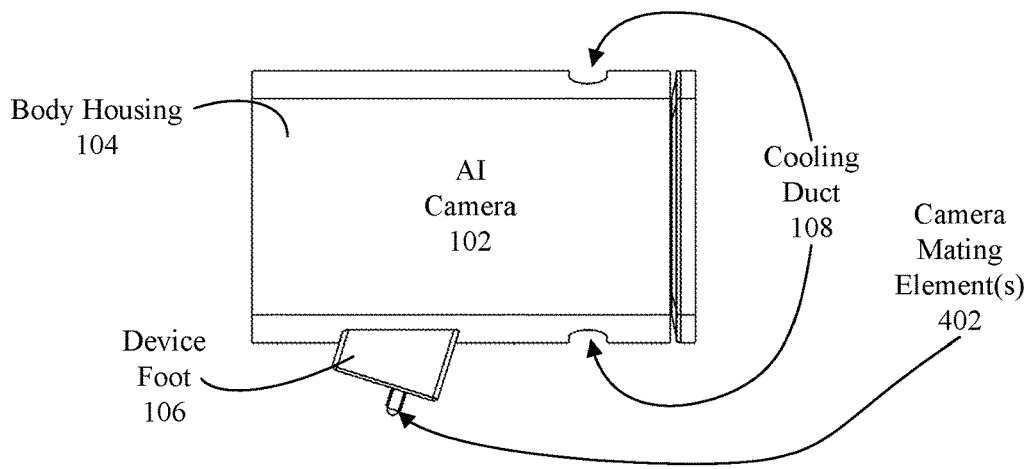
Figure 4C:
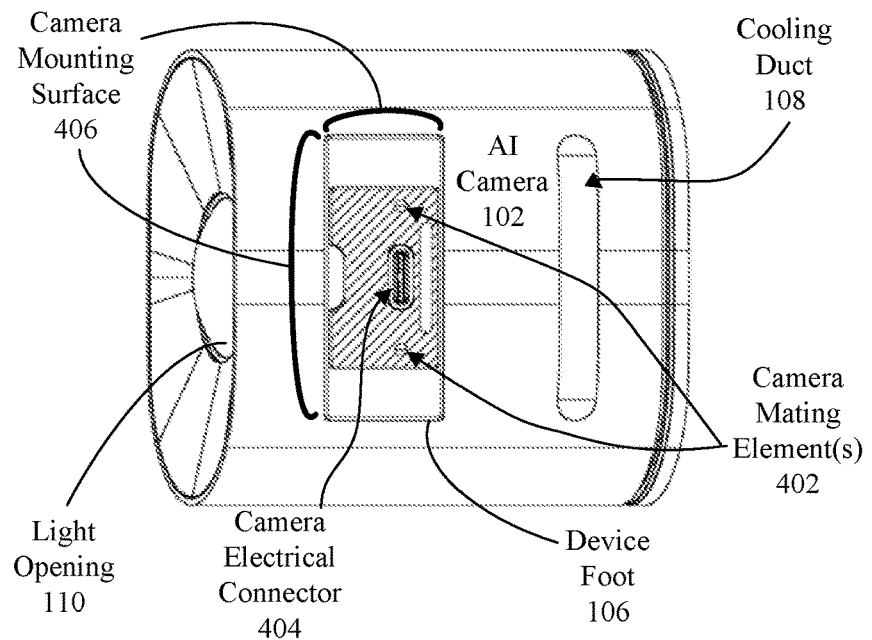

FIGS. 4A-4C depict front, side and bottom views, respectively, of AI camera 102 of FIG. 1, according to an embodiment. In particular, FIG. 4A is a front view of AI camera 102. With reference to FIGS. 1 and 2, AI camera 102 as depicted in FIG. 4A includes device foot 106 and light opening 110 as illustrated in FIG. 1. AI camera 102 of FIG. 4A also includes camera electrical connector 404 and camera mating element(s) 402. Camera electrical connector 404 comprises an electrical connector that corresponds to the type and opposite gender of device electrical connector 208 of parent device 202 as shown in FIG. 2. Likewise, camera mating element(s) 402 correspond to device mating element(s) 210 and engage therewith to facilitate coupling in the general manner described herein above. The inclusion of camera mating element(s) 402 in AI camera 102 provides a number of benefits. First, camera mating element(s) 402 are relatively easy to engage with device mating element(s) 210, and thereby facilitate the alignment of camera electrical connector 404 with device electrical connector 208. Indeed, the ease of engagement alignment provided by camera mating element(s) 402 may enable a user to couple AI camera 102 to parent device 202 without needing to look at or have a view of camera electrical connector 404 or device electrical connector 208. Further, device mating element(s) 210 may provide a stress relief function for camera electrical connector 404 which, for typical electrical connectors, cannot withstand any appreciable axial load, and are only designed to accommodate insertion and removal forces.

With continued reference to FIGS. 1 and 2, FIG. 4B depicts a side view of AI camera 102. FIG. 4B shows body housing 104, device foot 106 and camera mating element(s) 402 as shown in FIG. 4A. Also visible in the side view of FIG. 4B is cooling duct 108 described herein above, and in further detail below.

Finally, and with continued reference to FIGS. 1, 2 and 4A, FIG. 4C depicts a bottom view of AI camera 102. The bottom view of AI camera 102 as shown in FIG. 4C includes device foot 106, cooling duct 108, light opening 110, camera mating element(s) 402 and camera electrical connector 404. Device foot 106 includes camera mounting surface 406 which includes the rectangular region denoted by the brackets in the illustration, and in this embodiment is a planar surface. Except for camera mounting surface 406, each of the depicted components corresponds to those described above, and function in the same manner.

In embodiments, camera mounting surface 406 of device foot 106 is configured to come into close contact with a corresponding surface on parent device 202 when AI camera 102 is connected to parent device 202. For example, and with continued reference to FIG. 2, the corresponding surface comprises device mating surface 206 of parent device 202. As with device mating surface 206, camera mounting surface 406 may comprise a surface composed of different materials in different regions. For example, the portion of camera mounting surface 406 with the slanted lines shown in FIG. 4C corresponds, in one embodiment, to a steel plate that shall be further described herein below in conjunction with FIG. 6. The steel portion of camera mounting surface 406 facilitates the magnetic attraction of device foot 106 of AI camera 102 to the magnets or magnetic materials forming portions of device mating surface 206. The remaining portion of camera mounting surface 406 is formed from a bottom surface of device foot 106, in embodiments, and is thereby formed from the same material as device foot 106. For example, the portion of camera mounting surface 406 that corresponds to device foot 106 may comprise metal, an aluminum or other alloy, or thermally conductive plastic or composite. Embodiments will now be described in greater detail below wherein exploded and cutaway views are described.

Figure 5:
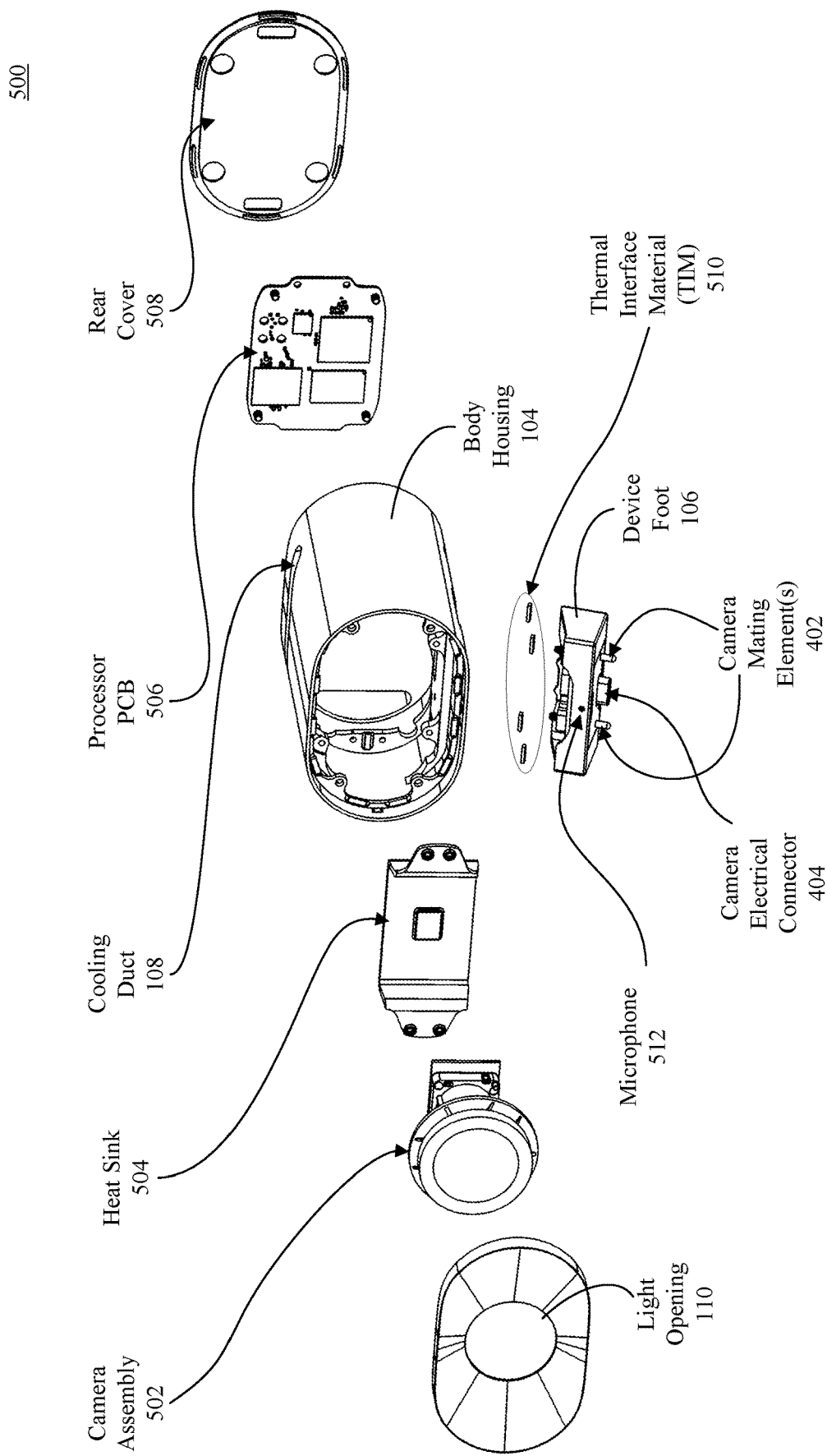
FIG. 5 depicts an exploded view diagram of the example accessory device of FIG. 1, according to an embodiment.

FIG. 5 depicts an exploded view diagram 500 of the AI camera 102 of FIG. 1, according to an embodiment. With continued reference to FIGS. 1, 2, and 4A-4C, previously described components of AI camera 102 are visible. In particular, body housing 104, device foot 106, cooling duct 108, light opening 110, camera electrical connector 404 and camera mating element(s) 402 are shown. Exploded view 500 of AI camera 102 as shown in FIG. 5 also includes a camera assembly 502, a heat sink 504, a processor printed circuit board (PCB) 506, rear cover 508, thermal interface material 510 and microphone 512. It should be understood that exploded view 500 of FIG. 5 illustrates those components and parts for understanding embodiments, and embodiments of AI camera 102 or any other accessory device may include additional components. For example, fasteners such screws and/or bolts that serve to connect the various components together are omitted. Likewise, certain electrical interconnections such as, for example, the required connection between camera electrical connector 404 and processor PCB 506 are not illustrated. One of ordinary skill will naturally appreciate that the view shown in FIG. 5 is not intended to be a complete and exhaustive illustration of all parts of AI camera 102.

Camera assembly 502 comprises components necessary for capturing an image. Although not illustrated in FIG. 5 or elsewhere, one of ordinary skill would understand such components to include, but necessarily be limited to a digital imaging device (e.g., CMOS or CCD sensors), one or more lenses or lens groups along with focusing apparatus and/or aperture control. In embodiments, digital images captured by camera assembly 502 are provided to processor PCB 506 for processing.

In an embodiment, heat sink 504 couples between the imaging sensor (not shown) of camera assembly 502 and body housing 104. More specifically, and as further described herein below in conjunction with FIGS. 8 and 9, the imaging sensor couples to heat sink 504 through a thermal interface material (TIM), and heat sink 504 likewise is coupled to body housing 104 through TIM deposited at the junctions between heat sink 504 and body housing 104. This arrangement enables heat to flow efficiently from the imaging sensor of camera assembly 502 into heat sink 504 and further through in body housing 104.

FIG. 5 also includes further depiction of device foot 106 along with the previously described camera electrical connector 404 and camera mating element(s) 402. Due to the exploded view perspective of FIG. 5, microphone 512 is also visible on the face of device foot 106. In embodiments, sounds such as voice commands may be captured by microphone 512 and provided to processor PCB 506 for processing. Although AI camera 102 as depicted in FIG. 5 illustrates only a single microphone (i.e., microphone 512), it should be understood that embodiments are not so limited. Other embodiments of AI camera 102 may include a plurality of microphones arranged in an array (e.g., linear or circular array) and be configured to employ digital signal beamforming techniques on the sound signals captured by each of the plurality of microphones.

In the illustrated embodiment, device foot 106 is configured to couple to body housing 104 through thermal interface material 510 at a number of contact points. FIG. 5 presently contemplates and illustrates four points of contact between device foot 106 and body housing 104 that include thermal interface material 510 placed in such contacts. It should be understood, however, that other embodiments and designs may provide thermal interface material 510 at more contact points to enable a reduction in the thermal resistance between body housing 104 and device foot 106. Thermal interface material 510 enables an efficient flow of heat between body housing 104 and device foot 106 thereby extending the thermal circuit described above. More specifically, heat generated by the imaging sensor of camera assembly 502 flows into heat sink 504, further into body housing 104 and at least partially into device foot 106 for subsequent transfer to parent device 202. However, not all heat from body housing 104 needs to flow through to device foot 106.

Instead, the embodiment of AI camera 102 illustrated in FIG. 5 includes cooling duct 108. Cooling duct 108 is formed in body housing 104 itself, whereby the exterior surface of body housing 104 extends into and through cooling duct 108. Heat within body housing 104 may then couple to the air within cooling duct 108 by conduction. The heated air within cooling duct 108, being less dense than ambient air, rises pulling cooler air in from the bottom opening of cooling duct 108. Thus, cooling duct 108 enables more efficient cooling of body housing 104 and in turn, the heat generating components such as camera assembly 502 and processor PCB 506 housed therein. As will be described in greater detail below, processor PCB 506 is positioned in direct contact with the rear interior surface of cooling duct 108, with the contact interface including additional TIM to facilitate the flow of heat from processor PCB 506 to cooling duct 108 of body housing 104. The combined cooling provided by cooling duct 108 formed in body housing 104 and the heat transfer to parent device 202 enabled by the thermal pathway into and through device foot 106, permits AI camera 102 to be physically smaller than it otherwise would have to be, and also enables a noisy cooling fan to be omitted.

FIG. 5 also illustrates rear cover 508 of body housing 104. In embodiments, rear cover 508 is formed of the same or similar thermally conductive material as body housing 104, and is coupled to body housing 104 through thermal interface material (not shown in FIG. 5). In such embodiments, heat rejection by AI camera 102 is further enhanced due to the increase in effective surface area and the corresponding increase in convective and radiant heat loss. This specification turns now to a more detailed description of device foot 106.

Figure 6:
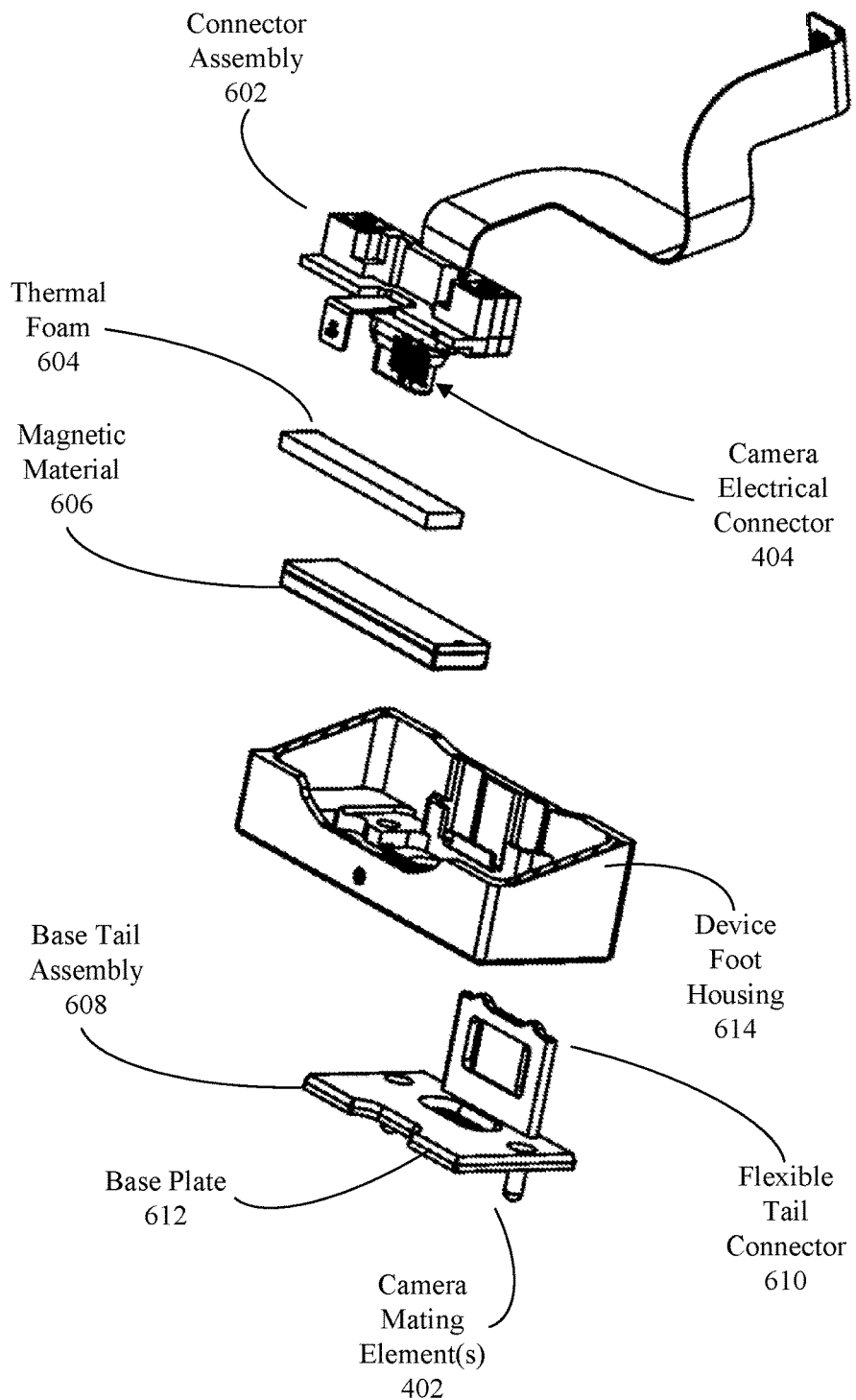
FIG. 6 depicts an exploded view of an example accessory device foot, according to an embodiment.

FIG. 6 depicts an exploded view 600 of device foot 106, according to an embodiment. Device foot 106 as illustrated in view 600 includes a connector assembly 602, a thermal foam 604, a magnetic material 606, a base tail assembly 608 and a device foot housing 614. Connector assembly 602 includes camera electrical connector 404 that may, in embodiments, comprise a USB-C connector as described further above. Base tail assembly 608 includes a flexible tail connector 610, a base plate 612 and camera mating element(s) 402.

Thermal foam 604 and magnetic material 606 are disposed within device foot housing 614. Thermal foam 604 serves to enhance the conduction of heat through device foot 106 and into parent device 202. Magnetic material 606 may comprise one or more of a permanent magnet or a ferromagnetic material, and serves to provide or facilitate the magnetic attraction, as further described herein above, between device foot 106 of AI camera 102, and device mounting surface 206 of accessory mount 204 as shown in FIG. 2. For example, magnetic material 606 may comprise a permanent magnet and base plate 612 may be composed of steel or other ferro. In such an instance, base plate 612 may itself become magnetized by virtue of the magnetic flux of the permanent magnet passing through the steel.

In embodiments, base plate 612 of base tail assembly 608 couples to device foot housing 614 via flexible tail connector 610. Flexible tail connector 610 may comprise or incorporate a flexible material (e.g. silicone rubber of a suitable stiffness). Base plate 612 of base tail assembly 608 is configured to couple to device foot housing 614 only at an attachment point on flexible tail connector 610 (not shown in FIG. 6). This coupling of base tail assembly 608 to device foot housing 614 only through flexible tail connector 610 allows base plate 612 of base tail assembly 608 to pivot through flexible tail connector 610 which acts as a hinging device.

Embodiments so configured enable AI camera 102 to pivot somewhat if accidentally bumped, pushed or otherwise struck, but without AI camera 102 becoming disengaged from its coupling to parent device 202. Such pivoting action acts as a stress relief for camera electrical connector 404 which, as mentioned above, may be incapable of withstanding any appreciable axial load, since typical connectors are only designed to accommodate insertion and removal forces. That is, the axial load that might otherwise be placed upon camera electrical connector 404 if the AI camera 102 is prevented by allowing device foot housing 614 (and consequently body housing 104 to which the device foot housing 614 is ultimately attached) to pivot away which results in camera electrical connector 404 merely disconnecting from corresponding device electrical connector 208 of accessory mount 204 as illustrated in FIG. 2. The above described pivoting/stress relief action will now be briefly described with reference to FIGS. 7A and 7B.

Figure 7A:
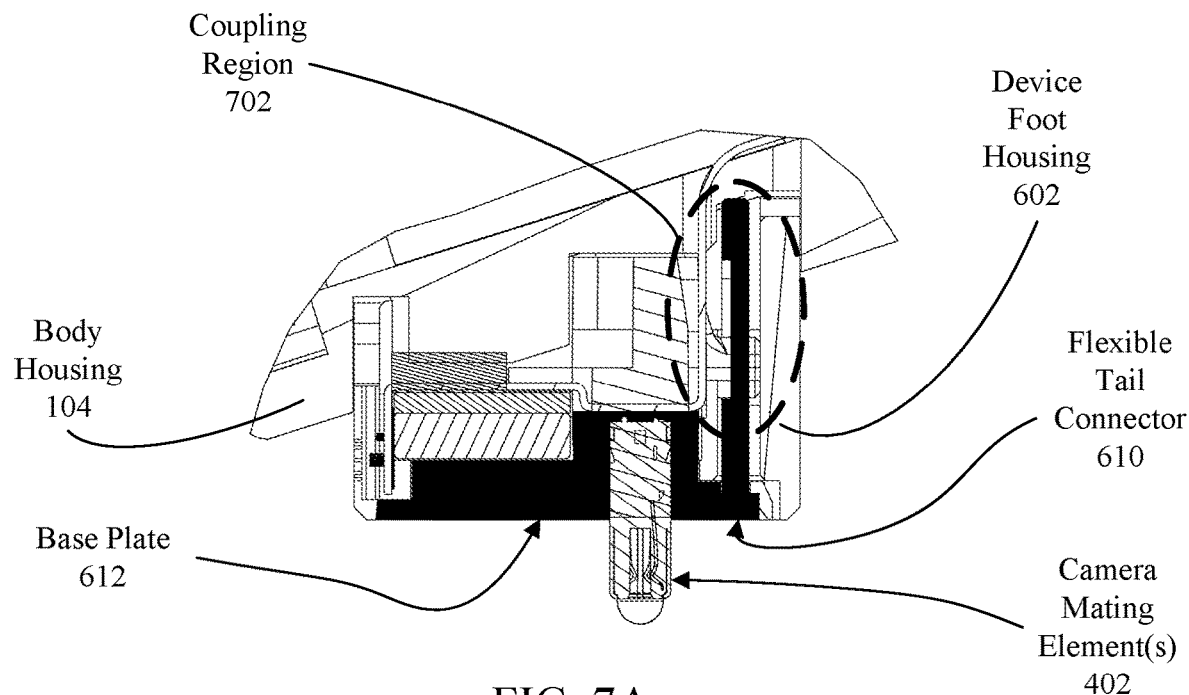
FIGS. 7A and 7B depict detailed side views of a device foot, according to an embodiment.
Figure 7B:
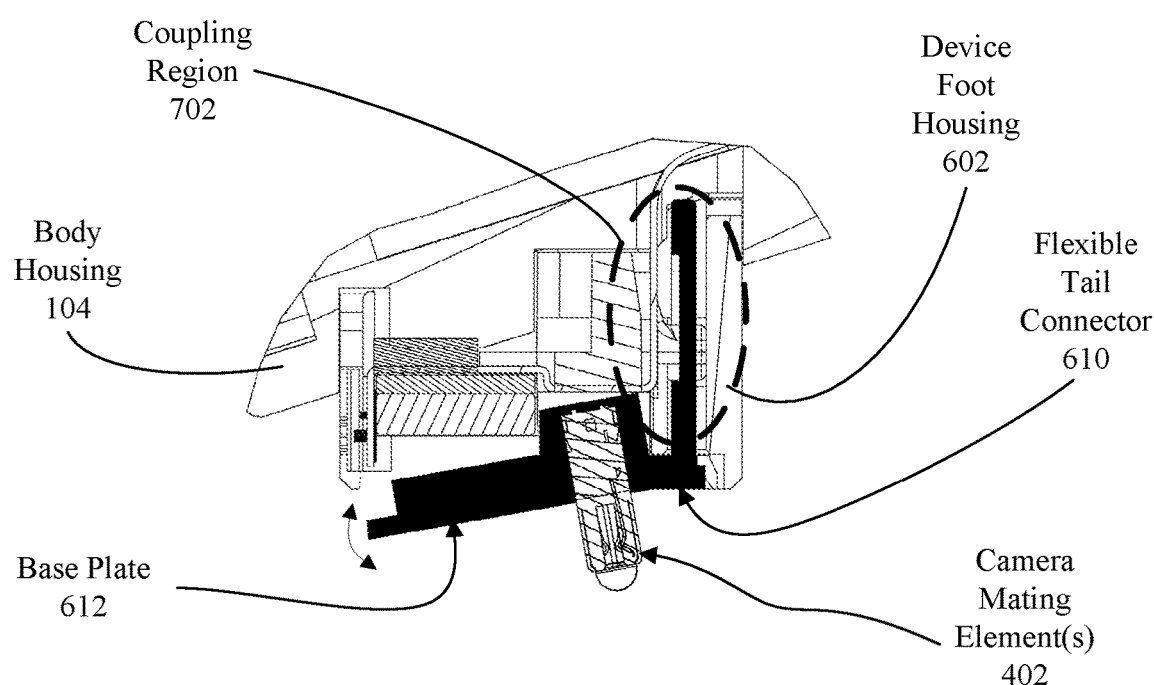

FIGS. 7A and 7B depict detailed side views 700 of device foot 106, according to an embodiment. Each of FIGS. 7A and 7B include body housing 104, camera mating element(s) 402, base plate 612, device foot housing 602, flexible tail connector 610 and coupling region 702. More specifically, FIGS. 7A and 7B illustrate a detailed side view of an embodiment of device foot 106 coupled to body housing 104 of AI camera 102. As described above, base plate 612 of base tail assembly 608 includes flexible tail connector 610 which together are illustrated in FIGS. 7A and 7B as solid black. Flexible tail connector 610 is coupled to device foot housing 614 only in the vertically aligned area within coupling region 702. The normal or resting position of base plate 612 of base tail assembly 608 within device foot housing 614 is shown in FIG. 7A, wherein the bottom surface of base plate 612 of base tail assembly 608 (i.e., the base plate 612 portion of camera mounting surface 406 as shown in FIG. 4C) is flush with the bottom surface of device foot housing 614.

FIG. 7B, on the other hand, shows base plate 612 of base tail assembly 608 in a deflected position. If a suitable force is placed upon the body housing 104 of AI camera 102, such force naturally is transmitted through to device foot housing 614 due to its coupling to body housing 104. Bearing in mind that when AI camera 102 is coupled to parent device 202 during normal operation, base plate 612 of base tail assembly 608 is coupled to device mounting surface 206 of accessory mount 204 via the magnetic force exerted by and/or between each device. Thus, when AI camera 102 is deflected, as illustrated in FIG. 7B, base plate 612 of base tail assembly 608 may disengage from its cavity within device foot housing 614 by pivoting through the hinging mechanism provided by flexible tail connector 610.

Figure 8:
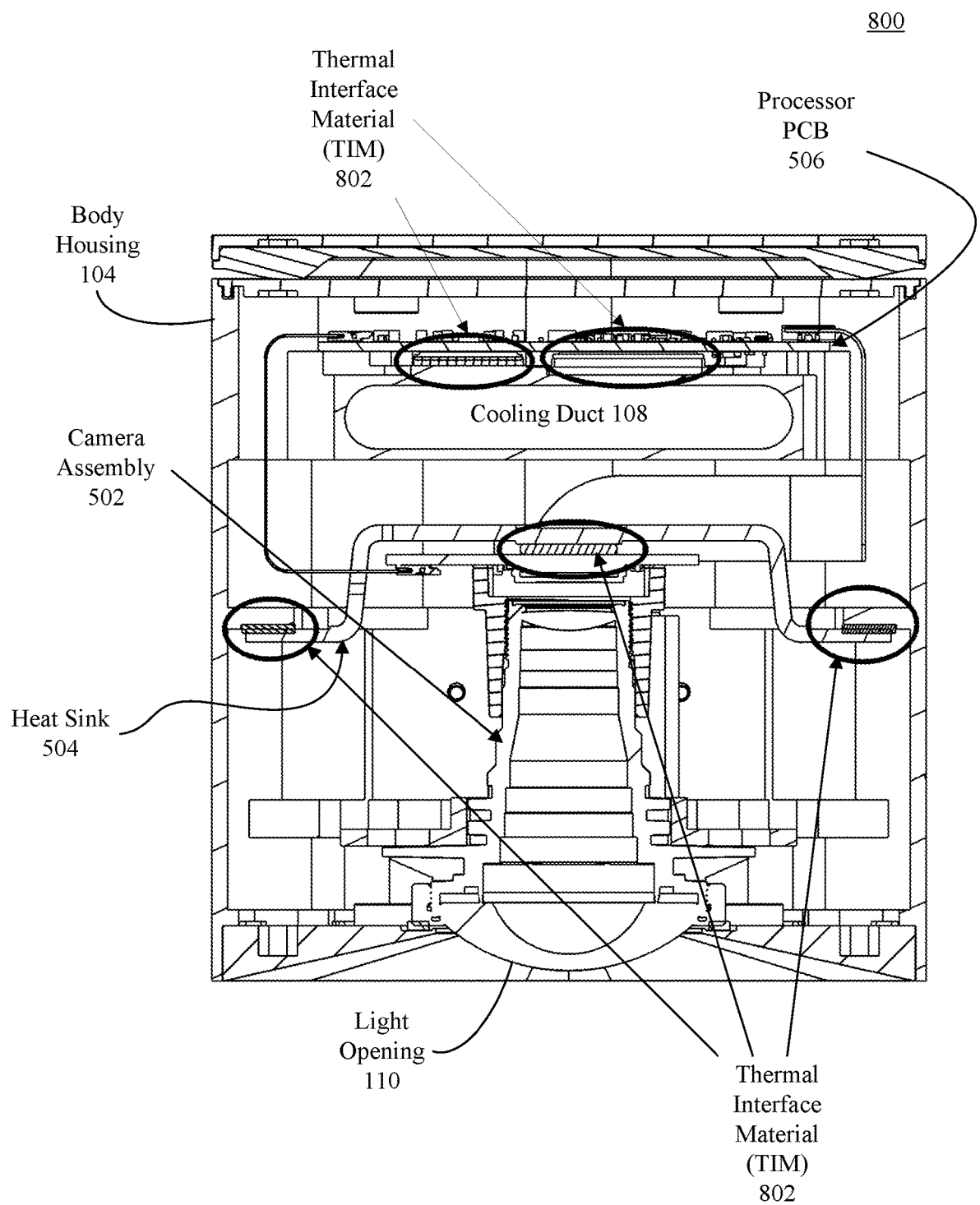
FIG. 8 depicts a cutaway top view of the example accessory device of FIG. 1, according to an embodiment.
Figure 9:
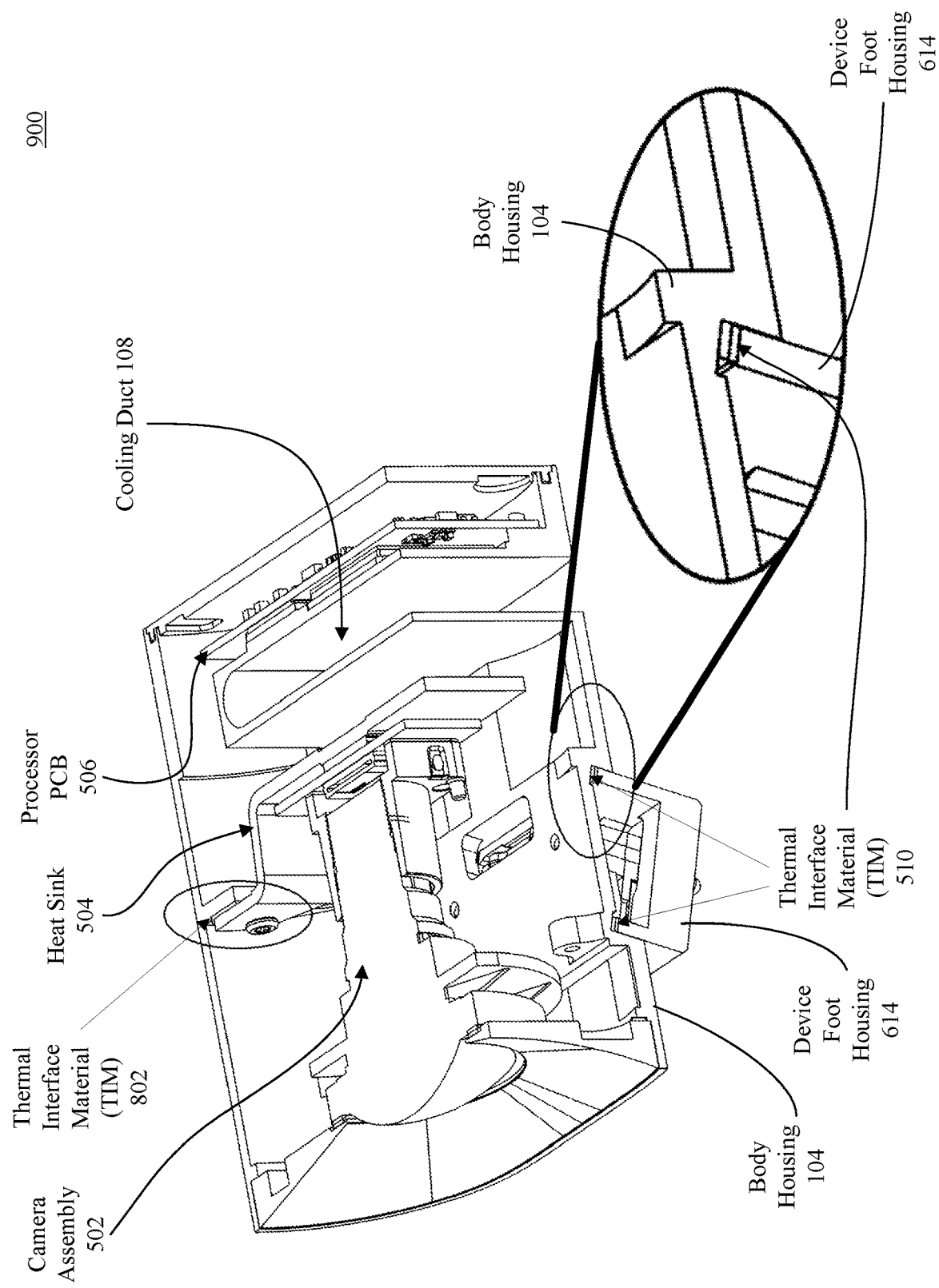
FIG. 9 depicts an additional cutaway view of the example accessory device of FIG. 1, according to an embodiment.

Further aspects of the thermal pathways present in embodiments of AI camera 102 will now be described. FIGS. 8 and 9 each depict detailed cutaway views that illustrate interior aspects of AI camera 102. In particular, FIG. 8 depicts a cutaway top view 800 of AI camera 102 of FIG. 1, according to an embodiment. FIG. 9 depicts an additional cutaway view 900 of AI camera 102 of FIG. 1, according to an embodiment, but from a different perspective than that of FIG. 8. Each will now be described in turn.

Cutaway view 800 of AI camera 102 as depicted in FIG. 8 includes body housing 104, cooling duct 108, light opening 110, camera assembly 502, heat sink 504, processor PCB 506, and thermal interface material 802. View 800 of FIG. 8 illustrates the physical and thermal coupling between various components as described herein above. In particular, FIG. 8 shows processor PCB 506 coupled to the surface of cooling duct 108 interior to body housing 104 through thermal interface material 802. Likewise, FIG. 8 illustrates the coupling of the image sensor of camera assembly 502 to heat sink 504 through thermal interface material 802 in a central interior portion of camera assembly 502. Last, FIG. 8 illustrates the connection of heat sink 504 and body housing 104 via thermal interface material 802 placed between the respective surfaces at the connection point.

FIG. 9 depicts an additional cutaway view 900 of AI camera 102 of FIG. 1, according to an embodiment, but from a different perspective than that of FIG. 8. View 900 of FIG. 9 includes body housing 104, cooling duct 108, camera assembly 502, heat sink 504, processor PCB 506, thermal interface material 510 and device foot housing 614. Cutaway view 900 of FIG. 9 again shows the coupling of the image sensor of camera assembly 502 to heat sink 504, and the coupling of heat sink 504 and body housing 104, each coupling via thermal interface material 802 placed between the respective surfaces at the connection point. FIG. 9 also includes a magnified view of the connection between device foot housing 614 and body housing 104. In particular, and with reference to FIG. 5, view 900 illustrates thermal interface material 510 disposed between body housing 104 and device foot housing 614 at junction between the housings. Thermal interface material displaces any air that may become trapped between the surfaces of body housing 104 and device foot housing 614. That is, no matter how well designed, carefully fabricated and apparently smooth the surfaces may be, the mechanical coupling interfaces will have air trapped between the component parts due to micro roughness and other imperfections of the respective surfaces. Thermal interface material has a much lower thermal resistance than the air it displaces, and effectively increases the contact surface area between the components by ensuring that the entire surface area of the contact region between the components is capable of carrying heat. Thus, the inclusion of thermal interface material in the mechanical coupling interfaces between components of AI camera 102 facilitates heat flow between such components, and thereby establishes a low thermal resistance thermal circuit between heat generating components of AI camera 102 (e.g., image sensor of camera assembly 502 and/or processing component(s) of processor PCB 506).

Indeed, embodiments may include a number of different thermal circuits that direct a flow of heat from heat generating components out of AI camera 102. For example, one thermal circuit is established between the image sensor of camera assembly 502 and parent device 202 wherein heat is directed to flow as follows:

from the image sensor of camera assembly 502 through thermal interface material 802 and into heat sink 504;
    from heat sink 504 through thermal interface material 802 and then on into body housing 104;
    from body housing 104 through thermal interface material 510 and into device foot housing 614;
    from device foot housing 614 into base plate 612; and
    from both device foot housing 614 and base plate 612 into device mating surface 206 of parent device 202.

In another example, a thermal circuit is established between one or more processing components of processor PCB 506 and parent device 202 wherein heat is directed to flow as follows:

from processor PCB 506 through thermal interface material 802 and into body housing 104;
    from body housing 104 through thermal interface material 510 and into device foot housing 614;
    from device foot housing 614 into base plate 612; and
    from both device foot housing 614 and base plate 612 into device mating surface 206 of parent device 202.

In yet another example, a thermal circuit is established between one or more processing components of processor PCB 506 and the air exterior to AI camera 102 wherein heat is directed to flow as follows:

from processor PCB 506 through thermal interface material 802 and into body housing 104; and
    from body housing 104 into the air within cooling duct 108.

In a further example, a thermal circuit is established between the image sensor of camera assembly 502 and the air exterior to AI camera 102 wherein heat is directed to flow as follows:

from the image sensor of camera assembly 502 through thermal interface material 802 and into heat sink 504;

from heat sink 504 through thermal interface material 802 and then on into body housing 104; and from body housing 104 into the air within cooling duct 108.

Note, embodiments may employ one or more of the abovementioned thermal circuits to meet the heat rejection needs of embodiments thereby keeping the exterior surface temperature of device, and the temperature of heat generating components within the device, within acceptable limits while simultaneously minimizing the surface area and volume of AI camera 102.

III. Additional Example Embodiments

A first electronic device is provided herein. The first electronic device, comprises: a device body housing; a first heat-generating component disposed within the device body housing; a first heat-conducting component disposed within the device body housing and coupled between the first heat-generating component and the device body housing; and a device foot, comprising: a device foot housing coupled to an exterior surface of the device body housing; and a first mating element connected to the device foot housing and adapted to engage with a corresponding second mating element of a second electronic device in a manner that mounts the first electronic device to the second electronic device and brings a planar portion of the device foot housing into contact with a planar mounting surface of the second electronic device; wherein the contact between the planar portion of the device foot housing and the planar mounting surface of the second electronic device completes a thermal circuit that comprises the first heat-generating component, the first heat-conducting component, the device body housing, the device foot housing and the planar mounting surface of the second electronic device and that facilitates the transfer of heat from the first heat-generating component to the second electronic device.

In an embodiment of the first electronic device, the device body housing, the first heat-conducting component, the device foot housing and the planar mounting surface of the second electronic device are each comprised of one or more of: a metal; an aluminum alloy; or a thermally conductive plastic.

In another embodiment of the first electronic device, the first heat-conducting component is connected to the first heat-generating component via a first layer of a thermal interface material and to the device body housing via a second layer of the thermal interface material, and wherein the device body housing is connected to the device foot housing via a third layer of the thermal interface material.

In an additional embodiment of the first electronic device, the first heat-generating component comprises one of an imaging sensor or a processing component.

In an embodiment of the first electronic device, the first mating element comprises a plate that is planarly aligned with the planar portion of the device foot housing and comprises a first magnetic material, the second mating element comprises a second magnetic material, and the first magnetic material and the second magnetic material comprise, respectively: a permanent magnet and a ferromagnetic material; a ferromagnetic material and a permanent magnet; or a first permanent magnet and a second permanent magnet.

In another embodiment of the first electronic device, the device foot further comprises a hinged member that flexibly connects the plate to the device foot housing and that enables the device foot to be rotated away from the second electronic device without disconnecting the first electronic device from the second electronic device.

In an additional embodiment of the first electronic device, the first mating element further comprises first and second alignment pins that extend perpendicularly from the plate and the second mating element further comprises first and second holes in the planar mounting surface of the second electronic device that are adapted to accommodate the first and second alignment pins, respectively.

In an embodiment of the first electronic device, the device foot further comprises a first electrical connector that extends from the planar portion of the device foot and is configured to engage with a second electrical connector located on the planar mounting surface of the second electronic device.

In another embodiment of the first electronic device, the first electronic device further comprises a second heat-generating component disposed within the device body housing and connected thereto.

In an additional embodiment of the first electronic device, the first electronic device comprises a camera and the second electronic device comprises one of a computer monitor or an interactive white board.

In an additional embodiment of the first electronic device, a device body housing; a heat-generating component disposed within and connected to the device body housing; and a device foot, comprising: a device foot housing coupled to an exterior surface of the device body housing; a first mating element connected to the device foot housing and adapted to engage with a corresponding second mating element of a second electronic device in a manner that physically couples the first and second electronic devices together and brings a planar portion of the device foot housing into contact with a planar mounting surface of the second electronic device; and a first electrical connector that protrudes from the planar portion of the device foot housing and is adapted to engage with a corresponding second electrical connector that is located on the planar mounting surface of the second electronic device when the first and second electronic devices are coupled together; wherein the contact between the planar portion of the device foot housing and the planar mounting surface of the second electronic device completes a thermal circuit that includes the heat-generating component, the device body housing, the device foot housing and the planar mounting surface of the second electronic device and that facilitates the transfer of heat from the first heat-generating component to the second electronic device.

In an embodiment of the first electronic device, the device body housing, the device foot housing and the planar mounting surface of the second electronic device are each comprised of one or more of: a metal; an aluminum alloy; or a thermally conductive plastic.

In another embodiment of the first electronic device, the heat-conducting component is connected to the device body housing via a first layer of a thermal interface material, and wherein the device body housing is connected to the device foot housing via a second layer of the thermal interface material.

In an additional embodiment of the first electronic device, the heat-generating component comprises one of an imaging sensor or a processing component.

In an embodiment of the first electronic device, the first mating element comprises a plate that is planarly aligned with the planar portion of the device foot housing and comprises a first magnetic material, the second mating element comprises a second magnetic material, and the first magnetic material and the second magnetic material comprise, respectively: a permanent magnet and a ferromagnetic material; a ferromagnetic material and a permanent magnet; or a first permanent magnet and a second permanent magnet.

In another embodiment of the first electronic device, the device foot further comprises a hinged member that flexibly connects the plate to the device foot housing and that enables the device foot to be rotated away from the second electronic device without disconnecting the first electronic device from the second electronic device.

In an additional embodiment of the first electronic device, the first mating element further comprises first and second alignment pins that extend perpendicularly from the plate and the second mating element further comprises first and second holes in the planar mounting surface of the second electronic device that are adapted to accommodate the first and second alignment pins, respectively.

In an embodiment of the first electronic device, the first and second electrical connectors comprise first and second Universal Serial Bus (USB) connectors, respectively.

In another embodiment of the first electronic device, the first electronic device comprises a camera and the second electronic device comprises one of a computer monitor or an interactive white board.

A system is provided herein, the system comprising: a first electronic device, comprising: a device body housing; a heat-generating component disposed within and connected to the device body housing; and a device foot comprising a device foot housing coupled to an exterior surface of the device body housing, a first mating element connected to the device foot housing, and a first electrical connector that protrudes from a planar portion of the device foot housing; and a second electronic device, comprising: a planar mounting surface; a second mating element adapted to engage with the first mating element in a manner that mounts the first electronic device to the second electronic device and brings the planar portion of the device foot housing into contact with the planar mounting surface; and a second electrical connector located on the planar mounting surface and adapted to engage with the first electrical connector when the first electronic device is mounted to the second electronic device; wherein the contact between the planar portion of the device foot housing and the planar mounting surface completes a thermal circuit that includes the heat-generating component, the device body housing, the device foot housing and the planar mounting surface and that facilitates the transfer of heat from the heat-generating component to the second electronic device.

IV. Conclusion

While various embodiments of the disclosed subject matter have been described above, it should be understood that they have been presented by way of example only, and not limitation. It will be understood by those skilled in the relevant art(s) that various changes in form and details may be made therein without departing from the spirit and scope of the embodiments as defined in the appended claims. Accordingly, the breadth and scope of the disclosed subject matter should not be limited by any of the above-described exemplary embodiments, but should be defined only in accordance with the following claims and their equivalents.

What is claimed is:

1. A first electronic device, comprising:
a device body housing;
a first heat-generating component disposed within the device body housing;
a first heat-conducting component disposed within the device body housing and coupled between the first heat-generating component and the device body housing; and
a device foot, comprising:
a device foot housing coupled to an exterior surface of the device body housing; and
a first mating element connected to the device foot housing and adapted to engage with a corresponding second mating element of a second electronic device in a manner that mounts the first electronic device to the second electronic device and brings a planar portion of the device foot housing into contact with a planar mounting surface of the second electronic device;
wherein the contact between the planar portion of the device foot housing and the planar mounting surface of the second electronic device completes a thermal circuit that comprises the first heat-generating component, the first heat-conducting component, the device body housing, the device foot housing and the planar mounting surface of the second electronic device and that facilitates the transfer of heat from the first heat-generating component to the second electronic device.

2. The first electronic device of claim 1, wherein the device body housing, the first heat-conducting component, the device foot housing and the planar mounting surface of the second electronic device are each comprised of one or more of:
a metal;
an aluminum alloy; or
a thermally conductive plastic.

3. The first electronic device of claim 1, wherein the first heat-conducting component is connected to the first heat-generating component via a first layer of a thermal interface material and to the device body housing via a second layer of the thermal interface material, and wherein the device body housing is connected to the device foot housing via a third layer of the thermal interface material.

4. The first electronic device of claim 1, wherein the first heat-generating component comprises one of an imaging sensor or a processing component.

5. The first electronic device of claim 1, wherein the first mating element comprises a plate that is planarly aligned with the planar portion of the device foot housing and comprises a first magnetic material, the second mating element comprises a second magnetic material, and the first magnetic material and the second magnetic material comprise, respectively:
a permanent magnet and a ferromagnetic material;
a ferromagnetic material and a permanent magnet; or
a first permanent magnet and a second permanent magnet.

6. The first electronic device of claim 5, wherein the device foot further comprises a hinged member that flexibly connects the plate to the device foot housing and that enables the device foot to be rotated away from the second electronic device without disconnecting the first electronic device from the second electronic device.

7. The first electronic device of claim 5, wherein the first mating element further comprises first and second alignment pins that extend perpendicularly from the plate and the second mating element further comprises first and second holes in the planar mounting surface of the second electronic device that are adapted to accommodate the first and second alignment pins, respectively.

8. The first electronic device of claim 1, wherein the device foot further comprises a first electrical connector that extends from the planar portion of the device foot and is configured to engage with a second electrical connector located on the planar mounting surface of the second electronic device.

9. The first electronic device of claim 1, further comprising:
a second heat-generating component disposed within the device body housing and connected thereto.

10. The first electronic device of claim 1, wherein the first electronic device comprises a camera and the second electronic device comprises one of a computer monitor or an interactive white board.

11. A first electronic device, comprising:
a device body housing;
a heat-generating component disposed within and connected to the device body housing; and
a device foot, comprising:
 a device foot housing coupled to an exterior surface of the device body housing;
 a first mating element connected to the device foot housing and adapted to engage with a corresponding second mating element of a second electronic device in a manner that physically couples the first and second electronic devices together and brings a planar portion of the device foot housing into contact with a planar mounting surface of the second electronic device; and
 a first electrical connector that protrudes from the planar portion of the device foot housing and is adapted to engage with a corresponding second electrical connector that is located on the planar mounting surface of the second electronic device when the first and second electronic devices are coupled together;
wherein the contact between the planar portion of the device foot housing and the planar mounting surface of the second electronic device completes a thermal circuit that includes the heat-generating component, the device body housing, the device foot housing and the planar mounting surface of the second electronic device and that facilitates the transfer of heat from the first heat-generating component to the second electronic device.

12. The first electronic device of claim 11, wherein the device body housing, the device foot housing and the planar mounting surface of the second electronic device are each comprised of one or more of:
a metal;
an aluminum alloy; or
a thermally conductive plastic.

13. The first electronic device of claim 11, wherein the heat-conducting component is connected to the device body housing via a first layer of a thermal interface material, and wherein the device body housing is connected to the device foot housing via a second layer of the thermal interface material.

14. The first electronic device of claim 11, wherein the heat-generating component comprises one of an imaging sensor or a processing component.

15. The first electronic device of claim 11, wherein the first mating element comprises a plate that is planarly aligned with the planar portion of the device foot housing and comprises a first magnetic material, the second mating element comprises a second magnetic material, and the first magnetic material and the second magnetic material comprise, respectively:
a permanent magnet and a ferromagnetic material;
a ferromagnetic material and a permanent magnet; or
a first permanent magnet and a second permanent magnet.

16. The first electronic device of claim 15, wherein the device foot further comprises a hinged member that flexibly connects the plate to the device foot housing and that enables the device foot to be rotated away from the second electronic device without disconnecting the first electronic device from the second electronic device.

17. The first electronic device of claim 15, wherein the first mating element further comprises first and second alignment pins that extend perpendicularly from the plate and the second mating element further comprises first and second holes in the planar mounting surface of the second electronic device that are adapted to accommodate the first and second alignment pins, respectively.

18. The first electronic device of claim 11, wherein the first and second electrical connectors comprise first and second Universal Serial Bus (USB) connectors, respectively.

19. The first electronic device of claim 11, wherein the first electronic device comprises a camera and the second electronic device comprises one of a computer monitor or an interactive white board.

20. A system, comprising:
a first electronic device, comprising:
 a device body housing;
 a heat-generating component disposed within and connected to the device body housing; and
 a device foot comprising a device foot housing coupled to an exterior surface of the device body housing, a first mating element connected to the device foot housing, and
 a first electrical connector that protrudes from a planar portion of the device foot housing; and
a second electronic device, comprising:
 a planar mounting surface;
 a second mating element adapted to engage with the first mating element in a manner that mounts the first electronic device to the second electronic device and brings the planar portion of the device foot housing into contact with the planar mounting surface; and
 a second electrical connector located on the planar mounting surface and adapted to engage with the first electrical connector when the first electronic device is mounted to the second electronic device;
wherein the contact between the planar portion of the device foot housing and the planar mounting surface completes a thermal circuit that includes the heat-generating component, the device body housing, the device foot housing and the planar mounting surface and that facilitates the transfer of heat from the heat-generating component to the second electronic device.

* * * * *